United States Patent
Iida et al.

(10) Patent No.: US 6,546,460 B1
(45) Date of Patent: Apr. 8, 2003

(54) RECORDING AND/OR REPRODUCING METHOD AND APPARATUS

(75) Inventors: Kenichi Iida, Saitama (JP); Yoshimichi Minakata, Kanagawa (JP)

(73) Assignee: Sony Corporation, Tokyo (JP)

( * ) Notice: Subject to any disclaimer, the term of this patent is extended or adjusted under 35 U.S.C. 154(b) by 90 days.

(21) Appl. No.: 09/679,100

(22) Filed: Oct. 4, 2000

(30) Foreign Application Priority Data

Oct. 4, 1999 (JP) .......................................... 11-283583

(51) Int. Cl.⁷ .............................................. G06F 12/00
(52) U.S. Cl. ............................. 711/115; 711/4; 360/69; 360/72.1
(58) Field of Search ....................... 711/115.4; 348/233, 348/333.02, 152–155, 207, 213, 230, 231; 360/99.06, 69–70.8, 69.71, 72.1, 99.02

(56) References Cited

U.S. PATENT DOCUMENTS

| | | | | |
|---|---|---|---|---|
| 5,381,178 A | * | 1/1995 | Miyamoto et al. ..... | 348/333.02 |
| 5,401,176 A | * | 3/1995 | Lwee .......................... | 439/64 |
| 5,590,306 A | * | 12/1996 | Watanabe et al. ........... | 348/233 |
| 5,657,081 A | * | 8/1997 | Kurahashi ................... | 348/233 |
| 5,850,103 A | * | 12/1998 | Takemura .................... | 257/679 |
| 5,867,345 A | * | 2/1999 | Endo et al. ............... | 360/99.06 |
| 5,875,455 A | * | 2/1999 | Ito ............................... | 710/52 |
| 5,903,871 A | * | 5/1999 | Terui et al. ................. | 704/270 |
| 5,937,136 A | * | 8/1999 | Sato ........................... | 386/125 |
| 6,268,977 B1 | * | 7/2001 | Yamada et al. .......... | 360/99.06 |

* cited by examiner

Primary Examiner—Matthew Kim
Assistant Examiner—Zhuo H. Li
(74) Attorney, Agent, or Firm—Jay H. Maioli

(57) ABSTRACT

A recording and/or reproducing method and apparatus in which, when it is detected during recording main data on a removable recording medium employing a storage unit that the recording medium has been moved to a position enabling releasing of the recording medium and an electrical connection between the recording unit and the recording medium is maintained, recording of the main data is halted, which subsidiary data managing the main data is recorded on the recording medium.

14 Claims, 8 Drawing Sheets

RECORDING AND/OR REPRODUCING METHOD AND APPARATUS

BACKGROUND OF THE INVENTION

1. Field of the Invention

This invention relates to a recording and/or reproducing method and apparatus in which, even if a recording medium is moved to an extraction enabling position during recording of main data on a removable recording medium, sub-data used for managing the main data is recorded even at the position of enabling extraction of the recording medium to enable management of the main data recorded on the recording medium.

2. Background

Up to now, there is proposed a recording and/or reproducing apparatus employing a memory carrying a soli-state storage device, such as a non-volatile memory, as a recording and/or reproducing apparatus for data handled by an information processing apparatus, typified by a personal computer, or as a recording and/or reproducing apparatus for audio or video data.

As this sort of the recording and/or reproducing apparatus, there is proposed such an apparatus in which a memory is interchangeable in order to enable free selection and recording and/or reproduction of a variety of pieces of the information. In the memory carrying a solid-state memory, data exchange with the recording and/or reproducing apparatus is possible simply on electrically connecting contacts provided on this memory to a connector provided on the recording and/or reproducing apparatus.

Thus, in the recording and/or reproducing apparatus employing the memory of this sort, the memory can be mounted or dismounted by a simplified mechanism without employing a complex loading mechanism such as is used in a recording and/or reproducing apparatus employing a disc-shaped recording medium, such as an optical disc or a magnetic disc. For example, a memory can be mounted, as electrical connection with respect to the recording and/or reproducing apparatus is maintained, by simply fitting the memory in an insertion/ejecting opening provided in a main body portion of the apparatus.

The memory that is mounted on the recording and/or reproducing apparatus by a simplified inserting operation can easily be taken out from the main body portion of the apparatus by an operation of extracting it from the main body portion of the apparatus.

With the recording and/or reproducing apparatus employing a memory constructed by loading a solid-state storage element, the memory can be easily mounted or dismounted, thus achieving improved tractability as compared to the case of the recording and/or reproducing apparatus employing a disc. With this sort of the recording and/or reproducing apparatus, the memory can be mounted or dismounted easily, while a mistaken operation, such as inadvertently ejecting the memory, is liable to be performed.

Amongst the data recorded and/or reproduced by the recording and/or reproducing apparatus employing this sort of the memory, there is stream data as data exhibiting temporal continuity in data contents and which is finished temporally continuously as recording data, typified by audio or video data. In recording this sort of the stream data, TOC (Table of Contents) data, such as address data indicating data recording positions, need to be updated at least at the time of the end of unit data representing data integrity. If, in recording the stream data, the TOC data is not updated, the data that existed during recording is deemed to be absent in the memory, as a result of which the data is not recorded in actuality.

If a memory is inadvertently ejected during recording of data, such as stream data, the recording operation is terminated without recording TOC data, such that the data is not recorded, whilst data transmitted to the recording and/or reproducing apparatus cannot be regenerated.

SUMMARY OF THE INVENTION

It is therefore an object of the present invention to provide a recording and/or reproducing apparatus in which, while ease in mounting or dismounting a memory is maintained, the memory may be prevented from being ejected inadvertently during recording of data to assure reliable data.

It is another object of the present invention to provide a recording and/or reproducing apparatus in which the recording operation of data on the memory can be continued even if the memory ejecting operation is executed.

It is further object of the present invention to provide a recording and/or reproducing apparatus in which it is possible to prohibit inadvertent memory ejection during data recording.

In one aspect, the present invention provides a recording and/or reproducing apparatus for recording and/or reproducing main data and subsidiary data used for managing the main data, for a removable recording medium, in which the apparatus includes recording and/or reproducing means for recording the main data and the subsidiary data on the recording medium, storage means for storing the subsidiary data, ejection means for causing the recording medium to be moved from a first position in which the recording medium is housed in a chassis to a second position in which the recording medium is extracted, as electrical connection between the recording medium and the recording means is maintained, detection means for detecting that the recording medium has been moved by the ejection means from the first position to the second position and control means for controlling the recording and/or reproducing means so that recording of the main data on the recording medium will be halted on detection of movement of the recording medium by the detection means and so that subsidiary data stored in the storage means and which is relevant to the main data already recorded will be recorded on the recording medium.

In another aspect, the present invention provides a recording and/or reproducing method for recording main data and subsidiary data for managing the main data, on or from a removable recording medium, in which the method includes the steps of recording the main data on the recording medium and generating the subsidiary data, and stopping recording on the recording medium of the main data and recording on the recording medium of the generated subsidiary data relevant to the main data already recorded if it is detected that the recording medium has been moved from a first position housing the recording medium in a chassis to a second position permitting the recording medium to be extracted as the electrical connection between the recording medium and the recording means is maintained.

In the recording and/or reproducing method and apparatus according to the present invention, the electrical connection between the contact provided in the memory and the connector is maintained in a state the memory ejecting operation is already performed by an ejection unit, so that the data recording state can be continued to effect reliable data recording. Moreover, since the alarm display is made in a state the recording operating mode is selected, it is possible to prevent inadvertent memory extraction to enable the recording of data being undertaken to be completed reliably.

DESCRIPTION OF THE PREFERRED EMBODIMENTS

Figure 1:
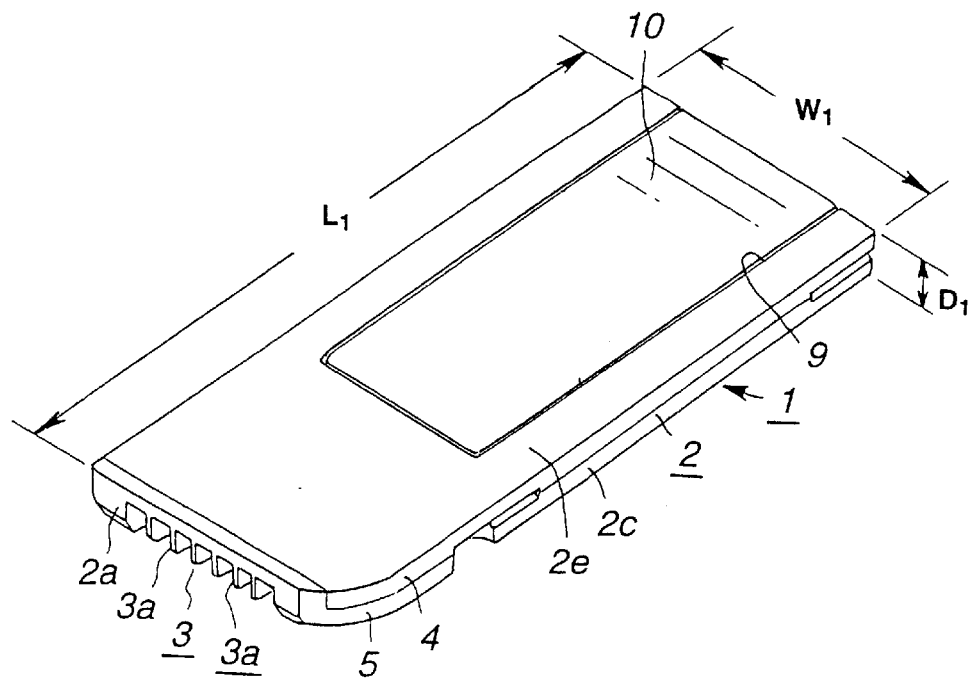
FIG. 1 is a perspective view showing a plate-shaped memory employed in a recording and/or reproducing apparatus according to the present invention.

Referring to the drawings, preferred embodiments of a recording and/or reproducing apparatus according to the present invention will be explained in detail.

The recording and/or reproducing apparatus according to the present invention is used for recording and/or reproducing stream data exhibiting temporal continuity, such as data handled in an information processing apparatus, typified by a personal computer, audio data or video data, and uses a memory 1, formed as a plate, as a recording medium. This plate-shaped memory 1 includes a casing 2, constituting a main body portion obtained on molding the synthetic resin, and a solid memory element, such as a non-volatile memory, having a large storage capacity of not less than e.g., 32 Mbyte. The memory 1 is substantially in the shape of a rectangle, with the short side of approximately 21.45 mm, the long side of approximately 50 mm and with a thickness D1 of approximately 2.8 mm, as shown in FIG. 1.

Figure 2:
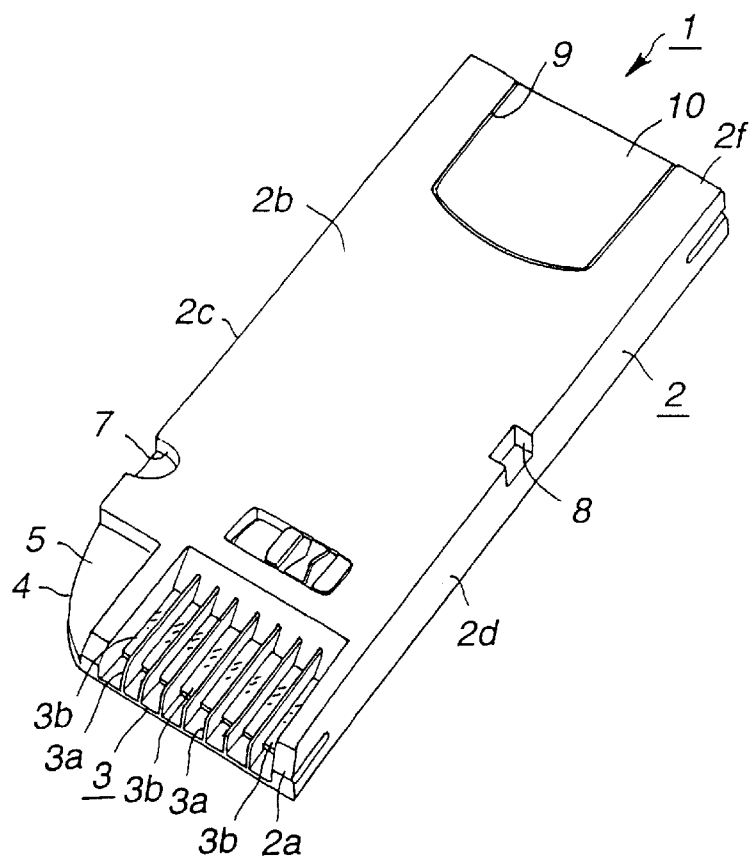
FIG. 2 is a perspective view showing the bottom surface of the plate-shaped memory.

On a front side 2a, as one of the short sides of the casing 2 constituting the plate-shaped memory 1, there is provided a terminal unit 3 for extending from a front surface 2a to a bottom surface 2b, as shown in FIGS. 1 and 2. On this terminal unit 3 are formed plural electrodes 3b separated from one another by partitioning wall sections 3a. Data recording or playback on or from the memory element provided in the casing 2 is by the electrodes 3b provided on the terminal unit 3.

In a corner towards the front side 2a of the casing 2, carrying the terminal unit 3, there is provided an arcuate cut-out 4 indicating the direction of insertion into the recording and/or reproducing apparatus. In a lateral side 2c of the casing 2 formed with the cut-out 4 is formed a mistaken insertion prohibiting groove 5, in continuation to the cut-out 4, by opening the bottom side of the casing 2, as shown in FIG. 2. The role of the cut-out 4 and the mistaken insertion prohibiting groove 5 is to control the inserting direction of the plate-shaped memory 1 with respect to the recording and/or reproducing apparatus at the time of loading of the plate-shaped memory 1 on the recording and/or reproducing apparatus to prohibit mistaken insertion.

In proximity to the terminal unit 3 on the bottom side 2b of the casing 2, there is provided a mistaken recording prohibiting switch 6 adapted for preventing mistaken recording of information signals on a semiconductor memory. The mistaken recording prohibiting switch 6 is connected to an operating knob in the casing 2 and, when the switch is slid in one or in the other direction, it permits data recording or prevents new data from being recorded in superposition, respectively. In one lateral side 2c of the casing 2 is formed an engagement recess 7 engaged by an engagement projection provided on the recording and/or reproducing apparatus on insertion of the plate-shaped memory 1 into the recording and/or reproducing apparatus to prevent the casing 2 from being detached from the recording and/or reproducing apparatus. Partway in the opposite lateral side 2d of the casing 2 is formed a loading detection recess 8, which is engaged by a detection unit provided on the recording and/or reproducing apparatus to detect the possible presence of the plate-shaped memory 1 loaded on the recording and/or reproducing apparatus.

On the casing 2 of the plate-shaped memory 1, there is provided a label bonding portion 9 extending from a planar side 2e to a back surface 2f and thence towards the bottom side 2b.

Figure 3:
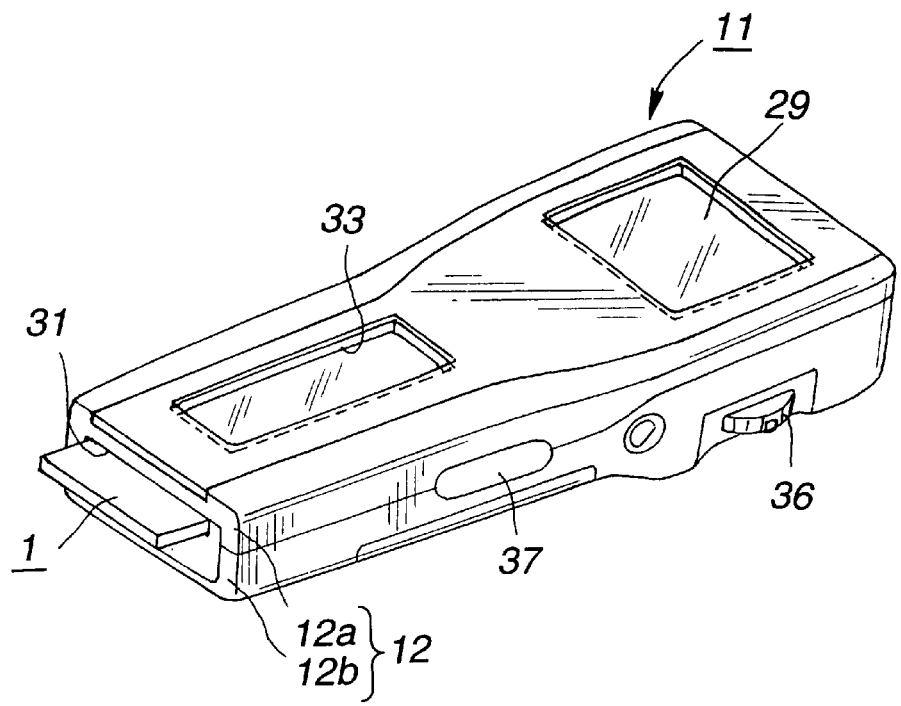
FIG. 3 is a perspective view of the recording and/or reproducing apparatus, looking from the recording and/or reproducing apparatus according to the present invention.
Figure 4:
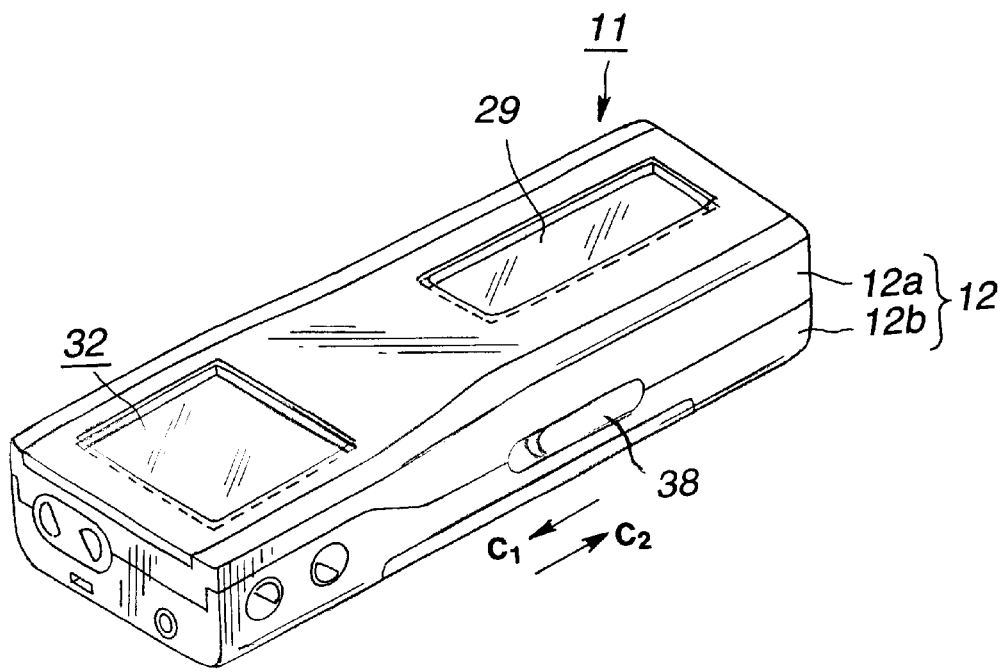
FIG. 4 is a perspective view of the recording and/or reproducing apparatus, looking from the front side, according to the present invention.

A recording and/or reproducing apparatus 11, employing the above-described plate-shaped memory 1 as a recording medium, includes a housing 12 constituting a main body portion of the apparatus, obtained on abutting and interconnecting upper and lower housing halves 12a, 12b, molded from a synthetic resin, as shown in FIGS. 3 and 4.

Within the housing 12 is arranged a holder 13 into which is inserted and held the plate-shaped memory 1. The holder 13 is mounted for movement on a chassis 14 arranged in the housing 12.

Figure 5:
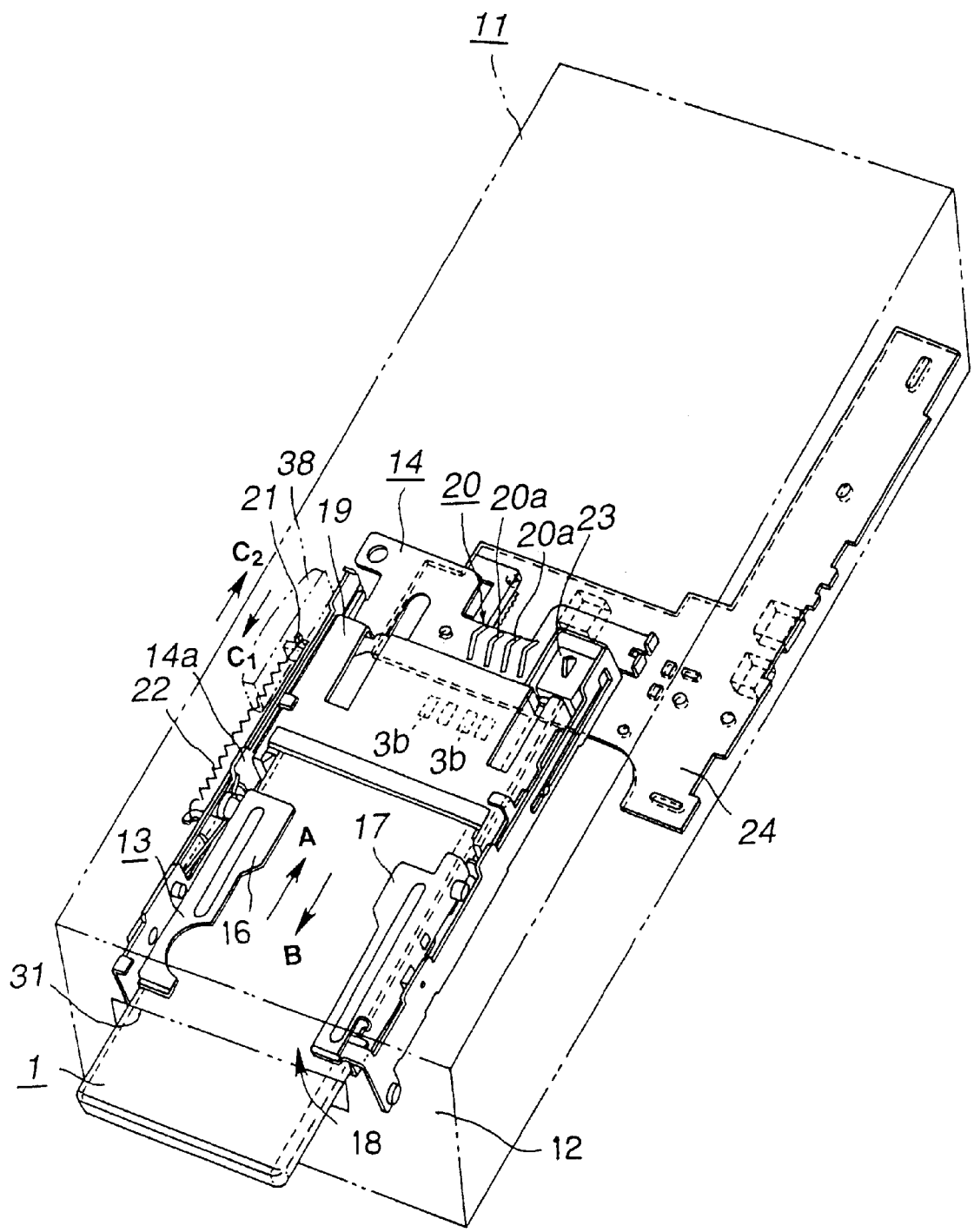
FIG. 5 is a perspective view of a holder on which to mount a plate-shaped memory of the recording and/or reproducing apparatus according to the present invention, with the plate-shaped memory being in the ejected state.
Figure 6:
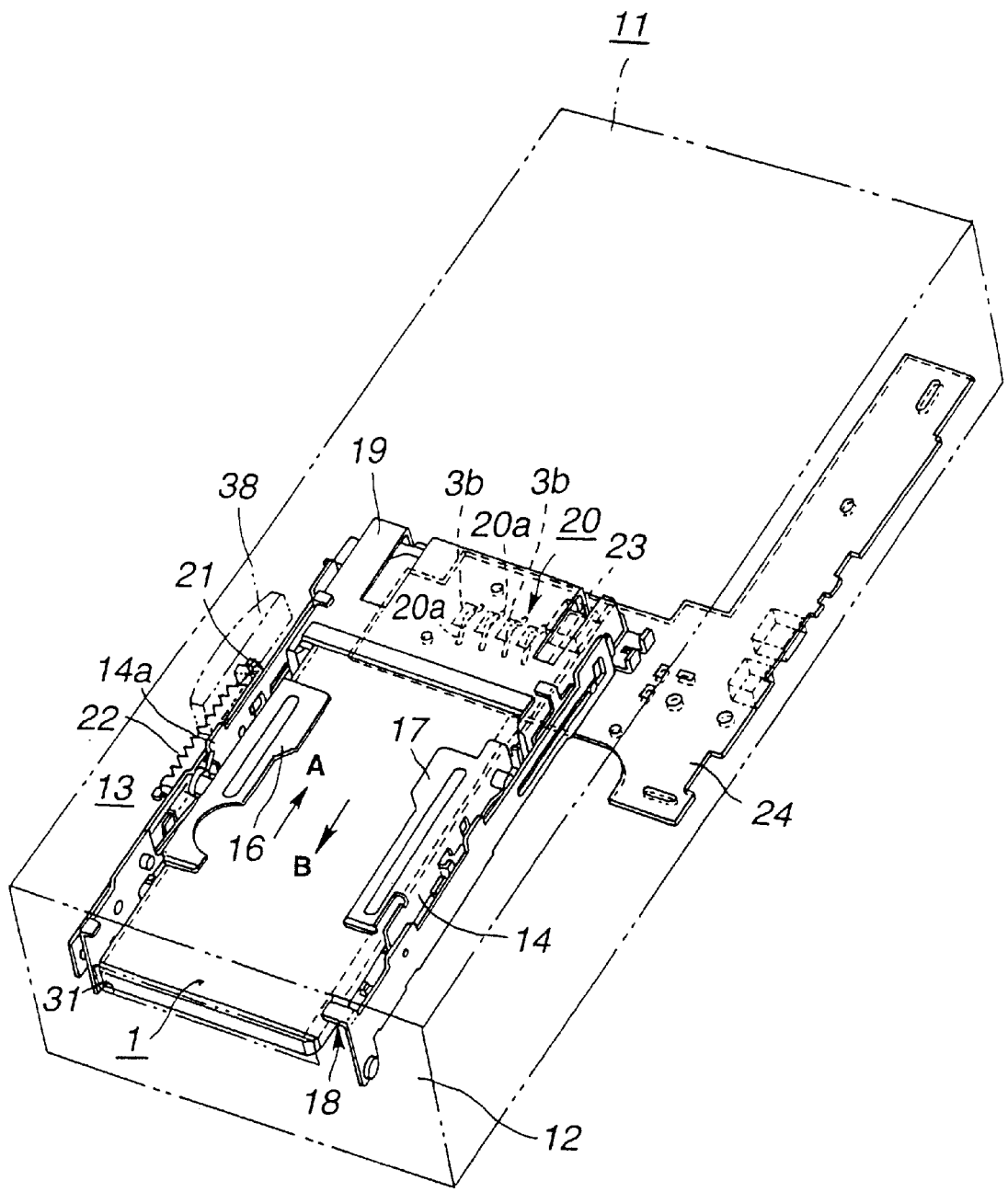
FIG. 6 is a perspective view showing the state in which the plate-shaped memory is inserted into the holder and the resulting assembly is loaded in the memory loading position.

On opposite lateral sides of the holder 13, movably mounted on the chassis 14, there are provided a pair of memory supports 16, 17, as shown in FIGS. 5 and 6. One open end of the holder 13 serves as an inserting/detachment portion 18 for the plate-shaped memory 1 inserted on or detached from the holder 13. On the side of the holder 13 opposite to its side carrying the inserting/detachment portion 18 is mounted a connector 19 to which is electrically connected the terminal unit 3 provided on the plate-shaped memory 1 inserted into the holder 13. The connector 19 is provided with a first set of terminals 20 comprised of plural terminals electrically connected to plural electrodes 3b of the terminal unit 3 of the plate-shaped memory 1, as shown in FIG. 5. The first set of terminals 20 is provided towards the inner end of the connector 19. The connector 19 includes a second set of terminals electrically connected to a connection terminal, not shown, provided on the recording and/or reproducing apparatus. The second set of terminals is adapted for exchanging data to be recorded and/or reproduced between a signal processing circuit provided in the recording and/or reproducing apparatus 11 and the memory in the plate-shaped memory 1. This second set of terminals is electrically connected to the plate-shaped memory 1 through the first set of terminals 20.

The holder 13, designed as described above, is mounted on the chassis 14 for movement in the direction indicated by arrows A and B in FIGS. 5 and 6. At this time, the holder 13 is prohibited from being detached from the chassis 14 by having a movement guide shaft, not shown, engaged and supported by a movement guide opening, bored in the chassis 14, and is mounted on the chassis 14 for movement in the direction indicated by arrows A and B in FIG. 5.

Between the holder 13 and the chassis 14 is mounted a toggle spring adapted for limiting movement of the holder 13 in the direction indicated by arrow A or B in FIG. 5. From the state in which the holder 13 is at an initial position shown in FIG. 5 permitting the plate-shaped memory 1 to be inserted into or detached from the recording and/or reproducing apparatus 11, the plate-shaped memory 1 is inserted into the holder 13. When the holder is moved to a position partway on the chassis 14, the biasing direction of the toggle spring is inverted, so that the holder is further moved in the direction indicated by arrow A in FIG. 5, under the bias of the toggle spring, until it is moved to a pre-set memory loading position.

If, from the state in which the holder 13 has been moved to the memory loading position, the holder 13 is moved in the direction indicated by arrow B in FIG. 5, until it is partway on the chassis 14, the biasing direction of the toggle spring is inverted, so that the holder is further moved in the direction indicated by arrow B in FIG. 5, under the bias of the toggle spring, until the holder reaches the ejecting position enabling insertion and ejection of the plate-shaped memory 1.

When the holder 13, carrying the plate-shaped memory 1 therein, is moved to the memory loading position in the recording and/or reproducing apparatus 11, an ejection lever 21, constituting an ejection unit movably supported on one sidewall section 14a of the chassis 14, is moved in the direction indicated by arrow Cylindrically-shaped battery 1 in FIG. 5, whereby the holder 13 is moved in the direction indicated by arrow B in FIG. 5 up to the insertion/detaching position. That is, the ejection unit is moved in the same direction as the direction of inserting the plate-shaped memory 1 into the holder 13 to eject the plate-shaped memory 1 inserted into and held by the holder 13.

Meanwhile, the ejection lever 21 is biased into movement in the direction indicated by arrow C2 in FIG. 5 under the bias of a tension coil spring 22 mounted under tension between the ejection lever 21 and the sidewall section 14a of the chassis 14.

It is noted that the recording and/or reproducing apparatus according to the present invention includes an ejection detection unit provided with an ejection detection switch 23 adapted for detecting the ejection state of the holder 13, as shown in FIG. 5. This ejection detection switch 23, constituting the ejection unit, is provided at such a position that, when the holder 13 is moved to the loading position in the recording and/or reproducing apparatus, as shown in FIG. 6, the switch 23 is thrust by the holder 13 to its on position, whereas, when the ejection lever 21 is actuated to move the holder 13 to the ejection position shown in FIG. 5, the switch is moved to its off position. That is, the ejection detection switch 23 is mounted on a flexible printed circuit board 24 mounted on the lower surface of the chassis 14 in a facing relation to the direction of movement of the holder 13.

Figure 7:
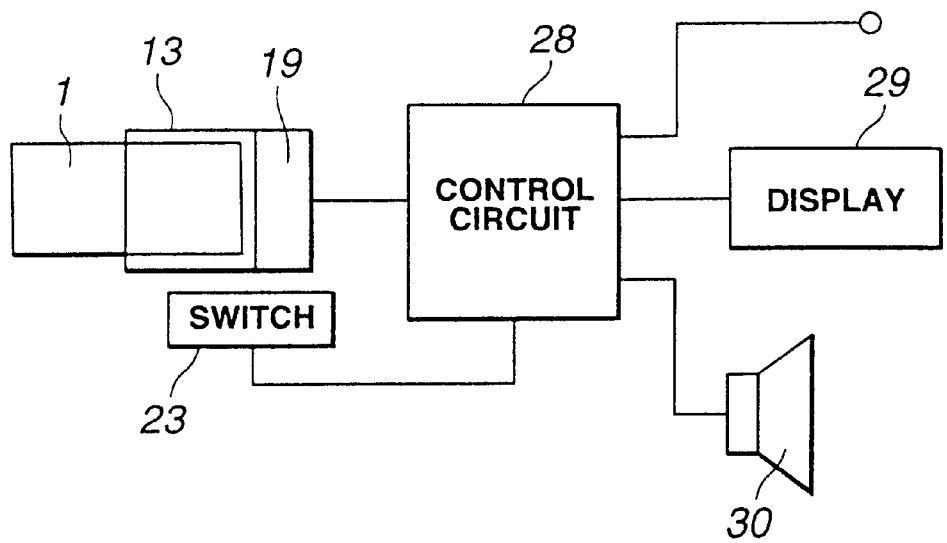
FIG. 7 is a block diagram showing an ejection detection mechanism of the recording and/or reproducing apparatus according to the present invention.

A detection output of the ejection detection switch 23, adapted for detecting the movement position of the holder 13 to detect whether or not the holder 13 is at the ejection position, is input to a control circuit unit 28 adapted for controlling the operating mode etc of the recording and/or reproducing apparatus, as shown in FIG. 7. When the ejection detection switch 23 is actuated by the holder 13 and thereby turned on, this control circuit unit 28 renders it possible to selectively set the recording and/or reproducing apparatus to a recording state or to a reproducing mode.

If, when the recording operating mode for the recording and/or reproducing apparatus is selected, the ejection lever 21 is actuated to shift the holder 13 to the ejecting position shown in FIG. 5 to turn the ejection detection switch 23 off, the control circuit unit 28 causes an alarm display signal to be issued to a display unit 29 and/or to an alarm sound generating device 30 provided on the recording and/or reproducing apparatus. Meanwhile, a speaker provided on the recording and/or reproducing apparatus may be used simultaneously as the alarm sound generating device 30.

As described above, the holder 13, mounted for movement on the chassis 14, is mounted within the housing 12, with the inserting/detachment portion 18 facing a memory inserting/detaching opening 31 provided on the back side of the housing 12.

On one end towards the front side from the mid position in the longitudinal direction of the housing 12 constituting the main body portion of the recording and/or reproducing apparatus 11, there is provided a display unit 29 constituted by e.g., a liquid crystal display member. On this display unit 29, alarm display etc is made based on an alarm display signal issued from the control circuit unit 28 when the operation of ejecting the plate-shaped memory 1 is performed in the operating mode of the recording and/or reproducing apparatus 11, in the data recording state or in the state in which the recording operating mode is selected. Towards the opposite end from the longitudinal mid portion towards the back side of the housing 12, there is provided a window 33 through which the holder 13 mounted in the housing 12 is exposed to outside.

In this recording and/or reproducing apparatus 11, there is provided a selecting operating unit 36 on one lateral side of the housing 2, for selecting the operating mode of this recording and/or reproducing apparatus 11, as shown in FIG. 3. If the selecting operating unit 36 is rotated about a pivot provided in the housing 12 as center, the selecting operating unit 36 selects the actuating mode, such as the recording mode or the playback mode, of the recording and/or reproducing apparatus 11, whereas, if the selecting operating unit 36 is thrust in a direction perpendicular to the lateral side of the housing 12, the selecting operating unit 36 determines the selected operating mode. At a mid portion of one lateral side of the housing 12 provided with the selecting operating unit 36, there is provided a hold button 37 for setting the selected operating mode.

On the opposite lateral surface of the housing 2, an ejection actuating button 38, which is connected to the ejection lever 21 taking charge of the operation of ejecting the holder 13 and which is provided in the housing 2, is mounted for movement in the direction indicated by arrows Cylindrically-shaped battery 1 and C2 in FIG. 4. When moved in the direction indicated by arrow Cylindrically-shaped battery 1 in FIG. 4, the ejection actuating button 38 operates for ejecting the holder 13 to project the plate-shaped memory 1 inserted and held in the holder 13 through the memory inserting/detaching opening 31 to outside of the housing 12, as shown in FIG. 3.

In the recording and/or reproducing apparatus according to the present invention, the selecting operating unit 36 selecting the operating mode is provided in a portion towards and end of the housing 12 with respect to its mid portion, and the ejection actuating button 38 is provided towards the opposite side of the housing 12 with respect to its mid portion. So, if the recording and/or reproducing apparatus 11 is held with one hand, and the hand or finger of the user is placed in front of the selecting operating unit 36, the ejection actuating button 38 is placed at a position difficult to operate with the hand or finger, whereas, if the hand or finger of the user is placed to actuate the ejection actuating button 38, the selecting operating unit 36 is placed at a position difficult to operate with the hand or finger, so that it is possible to evade the mistaken operation of inadvertently actuating the ejection actuating button 38 during data recording and/or reproduction to eject the plate-shaped memory 1 loaded on the recording and/or reproducing apparatus 11.

The state of loading the plate-shaped memory 1 on the above-described recording and/or reproducing apparatus 11 and the state of ejecting the plate-shaped memory 1 loaded on the recording and/or reproducing apparatus 11 are hereinafter explained.

For loading the plate-shaped memory 1 on the recording and/or reproducing apparatus 11, the ejection actuating button 38 is actuated to shift the holder 13 to an ejection position towards the memory inserting/detaching opening 31 of the housing, as shown in FIG. 5. If the plate-shaped memory 1 is inserted through the memory inserting/detaching opening 31 into the housing 12, with the side of the plate-shaped memory 1 provided with the terminal unit 3 as an inserting end, the plate-shaped memory 1 is held in the holder 13 moved to the ejecting position, as shown in FIG. 15. If, after the plate-shaped memory 1 is inserted into the housing 12, the plate-shaped memory 1 is further inserted into the housing 12, the holder 13 is moved, along with the plate-shaped memory 1, towards the loading position indicated by arrow A in FIG. 5. When the holder 13 is moved to the loading position, and the plate-shaped memory 1 is further intruded into the housing 12, the plate-shaped memory 1 is unified with the holder 13 and is loaded in the loading position shown in FIG. 6, as the terminal unit 3 of the plate-shaped memory 1 is electrically connected to the first set of terminals 20 provided on the connector 19.

When the holder 13 is moved to the loading position, the second set of the terminals is electrically connected to connection terminals provided on the recording and/or reproducing apparatus to enable data exchange to be made between the signal processing circuit provided in the recording and/or reproducing apparatus 11 and the memory in the plate-shaped memory 1.

When the plate-shaped memory 1 is inserted and the holder 13 is inserted to the loading position along with the plate-shaped memory 1, the ejection detection switch 23 is thrust by a portion of the holder 13 or a portion of the plate-shaped memory 1 loaded on the holder 13, to permit the detection that the plate-shaped memory 1 has been loaded in the memory loading position.

Meanwhile, if the plate-shaped memory 1 is held by the holder 13 and loaded in the memory loading position, the electrodes 3b of the terminal unit 3 are electrically connected to the terminal 20a of the first set of terminals 20 making up terminals 20 of the connector 19, at the same time as the terminal unit 3 is mechanically fitted and unified to the connector 19. Therefore, if the plate-shaped memory 1 is loaded on the recording and/or reproducing apparatus, the terminal unit 3 is movable in unison with the holder 13 as the terminal unit 3 is electrically connected to the connector 19.

So, in the recording and/or reproducing apparatus according to the present invention, if the plate-shaped memory 1 is in the memory loading state along with the holder 13, as shown in FIG. 6, and the holder 13 is moved in the direction indicated by arrow B in FIG. 5, by the ejection actuating button 38 being moved in the direction indicated by arrow C2 in FIG. 4, the plate-shaped memory 1 moved in unison with the holder 13, as the terminal unit 3 of the plate-shaped memory 1 is electrically connected to the connector 19. If the holder 13 is moved to a position enabling insertion and detachment of the plate-shaped memory 1, as shown in FIG. 5, such that a portion of the plate-shaped memory 1 is projected from the memory inserting/detaching opening 31, as shown in FIG. 3, the electrical connection to the connector 19 is maintained, as long as the plate-shaped memory 1 is not released from the memory inserting/detaching opening 31.

So, in the recording and/or reproducing apparatus according to the present invention, if the plate-shaped memory 1 is once loaded on the memory loading unit, the plate-shaped memory 1 remains electrically connected to the data recording and/or reproducing circuit on the recording and/or reproducing apparatus through the connector 19 provided on the holder 13, to enable data recording and/or reproduction.

Figure 8:
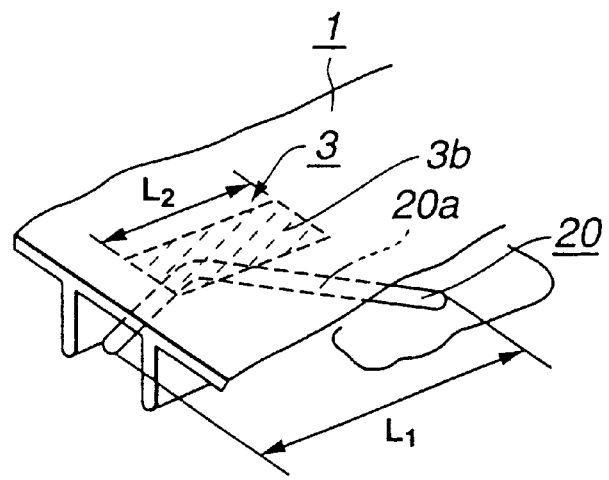
FIG. 8 is a perspective view showing the relation between an electrode constituting a terminal unit provided on the plate-shaped memory and a terminal of a first set of terminals provided on a connector.

Meanwhile, with the plate-shaped memory 1 which is simply inserted into the holder 13 so as to be mechanically and electrically connected to the connector 19, it is likely that, when the plate-shaped memory 1 is moved along with the holder 13 towards the ejecting position, by the ejecting operation, the plate-shaped memory 1 be moved slightly in the direction of being extracted from the connector 19. So, the length L1 of the terminal 20a of the first set of terminals 20 provided on the connector 19 is set so as to be longer than the length L2 of the electrode 3b of the terminal unit 3 of the plate-shaped memory 1, as shown in FIG. 8. By an arrangement in which, when the plate-shaped memory 1 is loaded at the memory loading position, the electrode 3b is fitted onto the proximal end of the terminal 20a of the first set of terminals 20, the state of electrical connection to the connector 19 may be reliably kept even if the plate-shaped memory 1 is moved in the ejecting direction of being released from the connector 19 as indicated by arrow B in FIG. 5.

If, in the recording and/or reproducing apparatus according to the present invention, the ejection detection switch 23 has detected that the plate-shaped memory 1 has been intruded into the holder 13 and the holder 13 has been loaded on the memory loading position, the detection output is input to the control circuit unit 28 adapted for controlling e.g., the operating mode of the present recording and/or reproducing apparatus to render it possible for the recording and/or reproducing apparatus to select the recording operating mode or the playback operating mode, as shown in FIG. 7. If, when the loading of the holder 13 at the memory loading position is detected, the recording operating state is selected, data such as stream data to be transmitted to this recording and/or reproducing apparatus is recorded on the plate-shaped memory 1. If then the playback operating mode is selected, the data such as stream data recorded on the plate-shaped memory 1 is reproduced.

Figure 9:
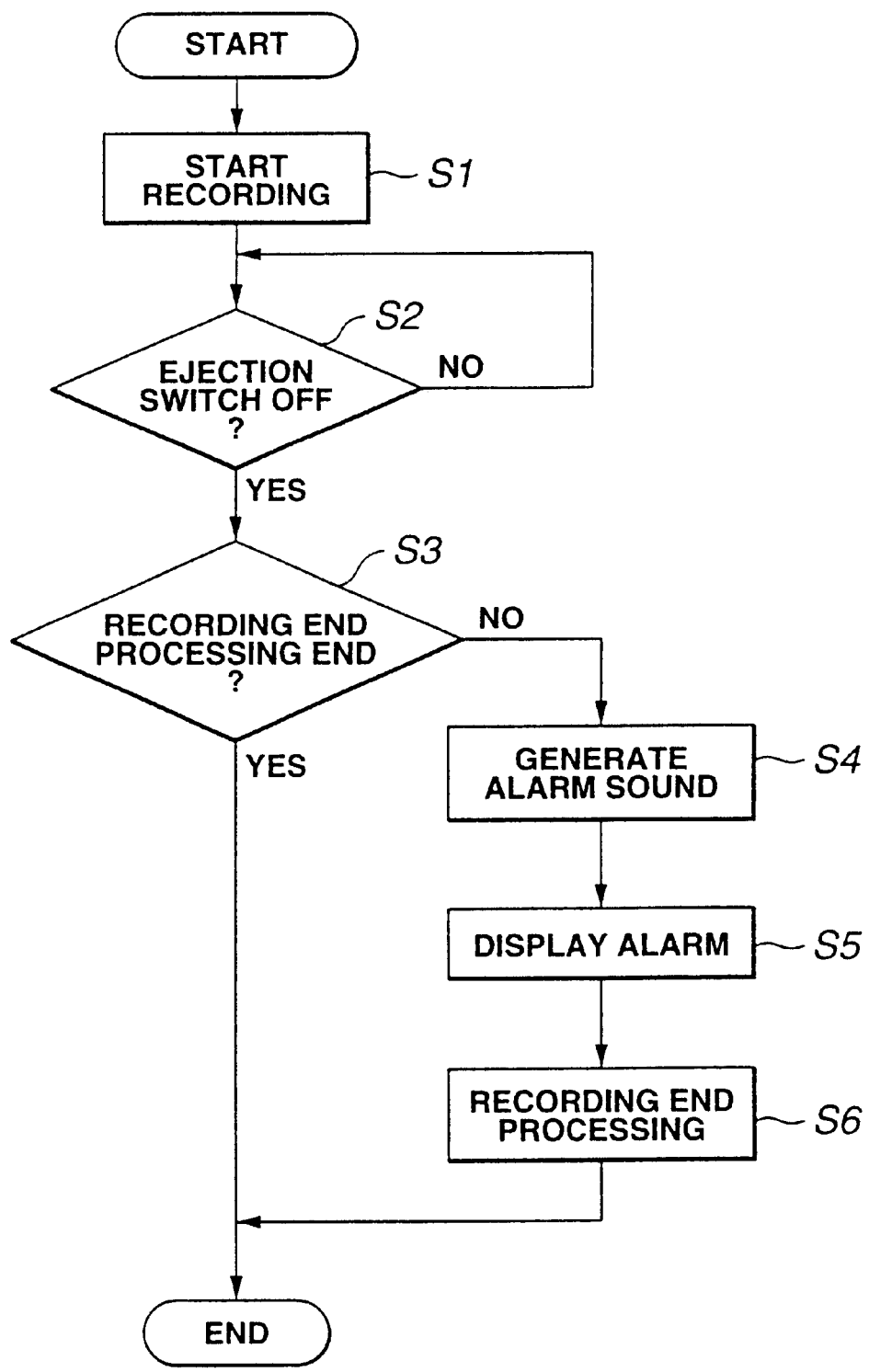
FIG. 9 is a flowchart for illustrating the state in which the ejection is performed as the recording operating mode is selected.

If, in the recording and/or reproducing apparatus according to the present invention, the recording operating mode for effecting data recording is selected, the recording operating mode thus selected is detected by the control circuit unit 28 at step S1 in FIG. 9. If the recording operating mode is selected, it is detected at step S2 whether or not the holder 13 has been acted on for ejection. If it is detected at step S2 that, as a result of the ejection actuating button 38 being moved in the direction indicated by arrow C2 in FIG. 4, the holder 13 has been moved in the direction indicated by arrow B in FIG. 5, the holder 13 has been moved to an ejecting position enabling the insertion and removal of the plate-shaped memory 1, as shown in FIG. 5, and the ejection detection switch 23 of an ejection detection unit is turned off, the control circuit unit 28 at step 3 verifies whether or not data recorded end processing has been carried out. This data recording end processing is the processing of updating TOC (Table-of-Contents) data, which is e.g., address data specifying the recording position of data recorded on the memory 1. Thus, it is verified whether or not this TOC data has been recorded in a TOC recording area of the memory 1. If the control circuit unit 28 has not detected that the data recording end processing has been done at step S3, the control circuit unit 28 causes an alarm sound generating signal to be output for producing an alarm sound as a warning pertinent to extraction of the plate-shaped memory 1 from the plate-shaped memory 1, to actuate the alarm sound generating device 30 to issue an alarm sound. The control circuit unit 28 causes an alarm display signal, displaying the alarm as warning pertinent to extraction of the plate-shaped memory 1 from the recording and/or reproducing apparatus, to be output, at the same time as it causes the alarm sound generating signals to be output, to display an alarm on the display unit 29.

When the plate-shaped memory 1 is loaded along with the holder 13 in the memory loading position, the plate-shaped memory 1 remains electrically connected to the data recording and/or reproducing circuit on the recording and/or reproducing apparatus, through the connector 19 provided on the holder 13, to enable data recording and/or reproduction, even if the ejection operation is performed in this state. So, if the alarm sound has been produced, or the alarm display has been made, the user recognizes that the data recording end processing has not as yet come to close, and completes the data recording end processing at step S6, after which the user takes out the memory 1 from the recording and/or reproducing apparatus. That is, if the ejection operation has been performed, recording of data such as stream data and updating of the TOC data can be done on the plate-shaped memory 1, thus providing for reliable data recording.

Figure 10:
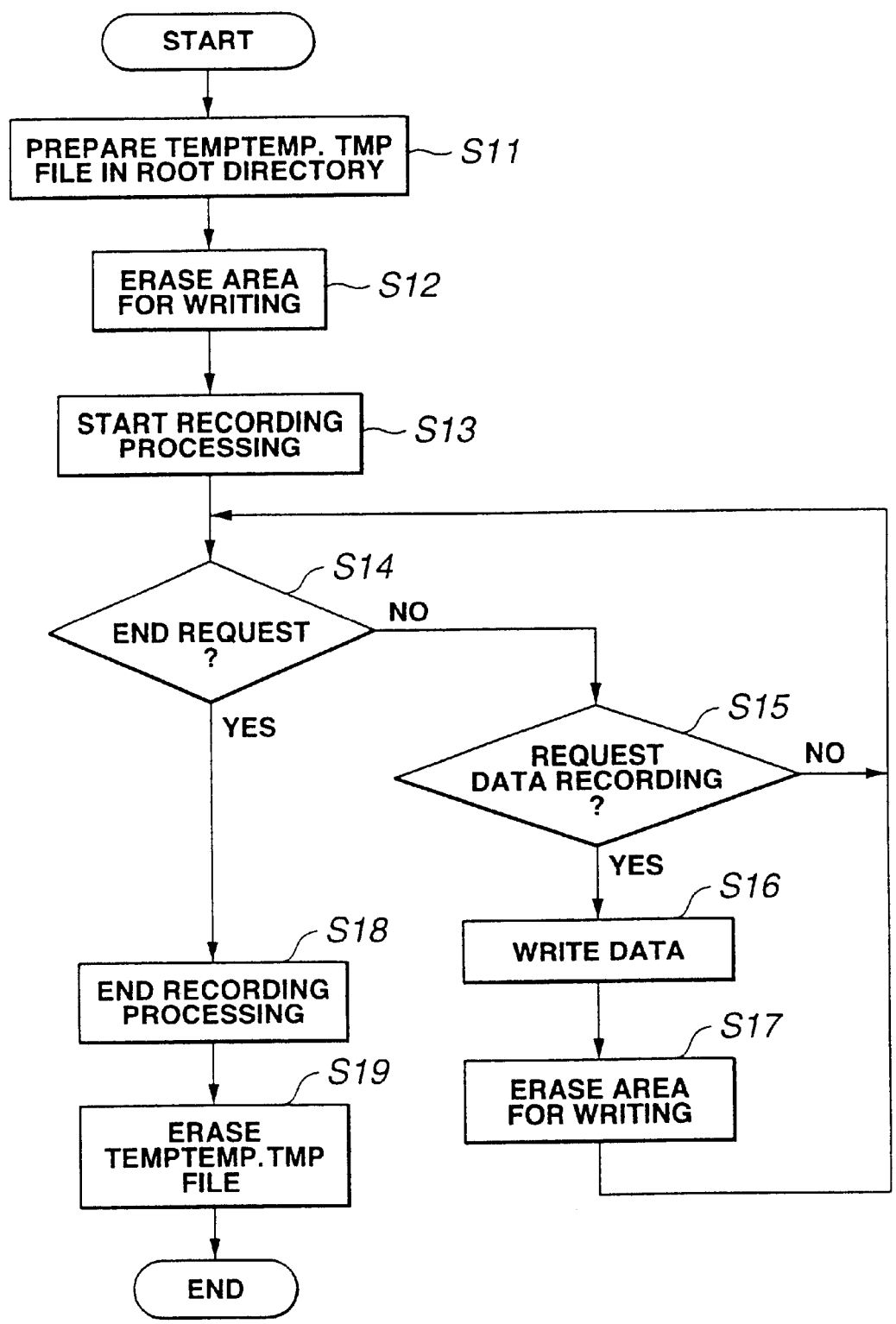
FIG. 10 is a flowchart for illustrating the data recording sequence for the memory.

The data recording on the plate-shaped memory 1 is now explained by referring to the flowchart shown in FIG. 10.

If the holder position detection switch 23, detecting the position of the holder 13 into which is inserted and held the plate-shaped memory 1, detects that the holder 13, having the plate-shaped memory 1 inserted and held therein, has been moved to the memory loading position, the control circuit unit 28 at step S11 prepares a TEMPTEMP.TMP file, as a file having a filename of TEMPTEMP and an identifier TMP, in a root directory of a recording area of the plate-shaped memory 1. The control circuit unit 28 then proceeds to step S12. The objective of using the TEMPTEMP.TMP file will be explained subsequently.

The control circuit unit 28 then at step S12 erases an area set for writing to proceed to step S13. Since the plate-shaped memory 1 is constituted by a non-volatile memory, which is e.g., an electrically erasable and overwritable memory, and cannot be overwritten, the control circuit unit 28 causes an area for storage of audio data to be previously erased in readiness for writing audio data therein.

At step S13, the control circuit unit 28 begins writing processing and subsequently proceeds to step 14.

At step S14, the control circuit unit 28 checks whether or not the user has pressed a stop button by way of performing the writing end processing. If the result of decision at this step S14 is NO, the control circuit unit 28 proceeds to step S15 and, if otherwise, the control circuit unit 28 proceeds to step S18.

At step S15, the control circuit unit 28 checks whether or not the user has pressed e.g., a recording button, by way of performing the writing processing. If the result of decision at this step S15 is YES, the control circuit unit 28 proceeds to step S16 and, if otherwise, the control circuit unit 28 reverts to step S14. That is, the control circuit unit 28 is at a standby state, in a loop of steps S14–S15–S14, until the user effects writing or end processing.

At step S16, the control circuit unit 28 causes audio data, supplied from e.g., an external personal computer, not shown, to be written in the writing area erased at step S12, before the control circuit unit 28 proceeds to step S17.

At step S17, the control circuit unit 28 erases a new area for writing, before reverting to step S14. That is, in a loop of steps S14–S15–S17–S14, the control circuit unit 28 repeats the process of erasing an area for writing and of writing of audio data in the erased area, until writing of the entire audio data sent from the external personal computer comes to a close.

At step 18, since the writing of the entire audio data has come to a close, the control circuit unit 2 8 updates the so-called TOC to terminate the recording processing to proceed to step S19.

At step S19, the control circuit unit 28 deletes the TEMPTEMP.TMP file to terminate the processing.

Figure 11:
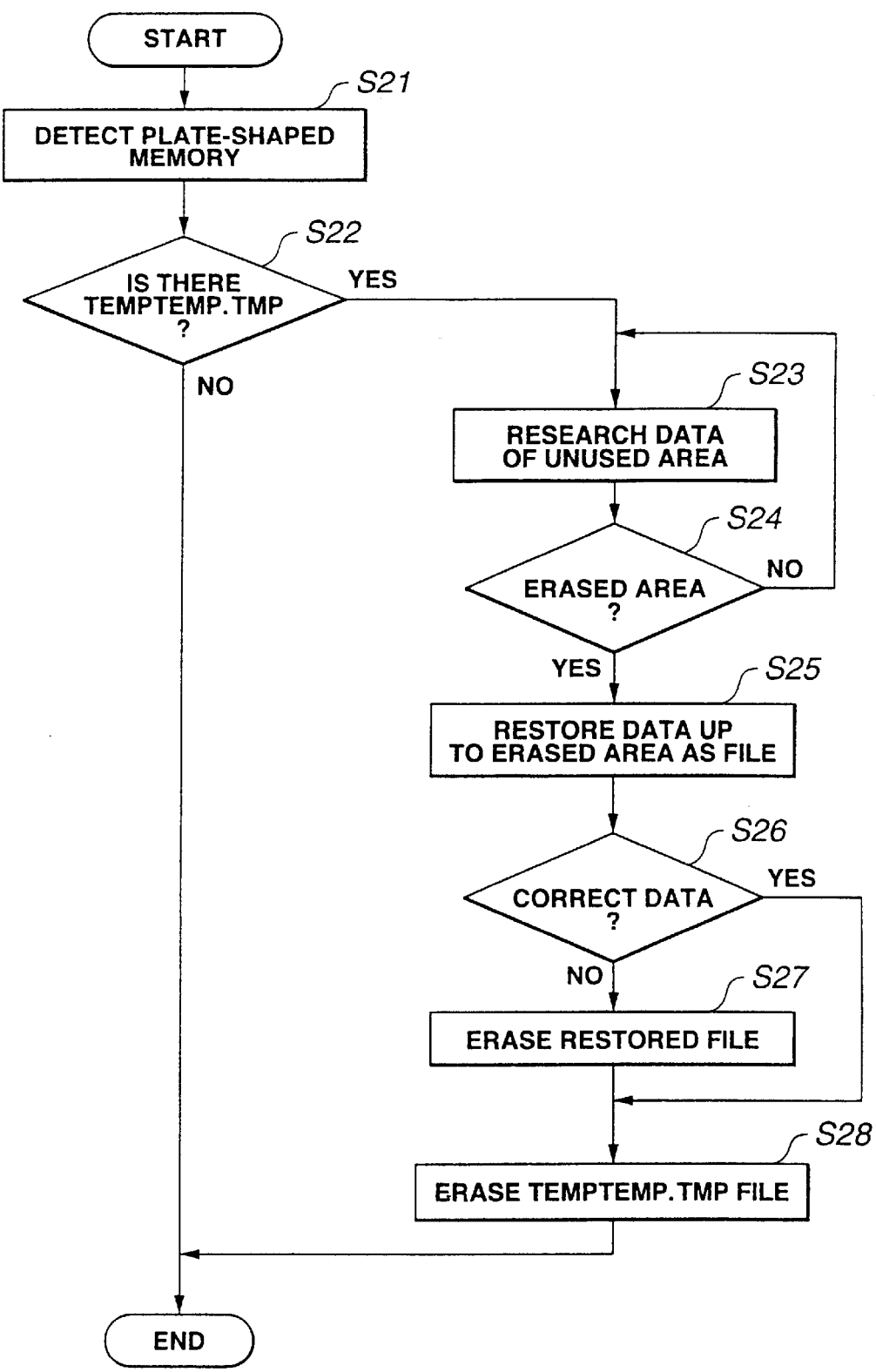
FIG. 11 is a flowchart showing the operating sequence of writing data in the memory after an unusual end operation.

Referring to the flowchart of FIG. 11, the writing processing in case of unusual termination, as the writing processing in case the user performs ejection processing before pressing e.g., a stop button, erroneously releases the plate-shaped memory 1 from the holder 13 and again inserts the plate-shaped memory 1 into the holder 13 on alarm notification as described above to load the plate-shaped memory 1 to the loading position in the recording and/or reproducing apparatus, is hereinafter explained.

If the control circuit unit 28 detects at step S21, based on the state of the holder position detection switch 23, that the holder 13, in which has been inserted and held the plate-shaped memory 1, has again been loaded on the memory loading position, the control circuit unit 28 proceeds to step S22.

At step S22, the control circuit unit 28 checks whether or not the TEMPTEMP.TMP file is in the root directory of the plate-shaped memory 1. If the result of decision at this step S22 is YES, the control circuit unit 28 proceeds to step S23 and, if otherwise, the control circuit unit 28 terminates the writing processing for unusual processing end. That is, in the absence of the TEMPTEMP.TMP file, the control circuit unit 28 decides that the writing processing shown in FIG. 10 has safely been completed and does not proceed to the writing processing for ususal processing end.

At step S23, the control circuit unit 28 retrieves data of the unused area to proceed to step S24.

At step S24, the control circuit unit 28 verifies whether or not the retrieval has reaches the erased area. If the result of decision at this step S24 is YES, that is if the retrieval has reached the erased area, the control circuit unit 28 proceeds to step S24 and, if otherwise, the control circuit unit 28 reverts to step 23. That is, the control circuit unit 28 retrieves the recorded area, in a loop of steps S23–S24, until retrieval reaches the erased area.

At step S25, the control circuit unit 28 restores the data of the area up to a point directly previous to the erasure, as the control circuit unit 28 deems the data as a file. The control circuit unit 28 then proceed to step S26.

At step S26, the control circuit unit 28 checks whether or not the restored file is audio data, that is whether or not it is a correct file, based on the leading end data of the restored file. If the result of decision at this step S26 is NO, that is if the file is not correct data, the control circuit unit 28 proceeds to step S27 and, if otherwise, to step S28.

At step S27, the control circuit unit 28 erases the restored file, to then proceed to step S28.

At step S28, the control circuit unit 28 erases the TEMPTEMP.TMP file to terminate the writing processing for this unusual end processing.

With the present recording and/or reproducing apparatus, as described above, the TEMPTEMP.TMP file is prepared when starting the writing of stream data, such as audio data, and the TEMPTEMP.TMP file is erased on normal completion of writing, thereby enabling the unusual end of writing to be detected readily. By preparing the TEMPTEMP.TMP file in the root directory, the detection can be performed readily and speedily.

Although a plate-shaped memory is used in the above-described embodiment as a memory, the memory shape is not limited to this specified shape such that a variety of other suitable memory shapes may be used if such shape permits the memory to be inserted into and detached from the recording and/or reproducing apparatus. For example, MultiMediaCard (MMC), proposed by Siemens, SanDisk, Hitachi, Motorola, NEC or Nokia, or an SD memory card proposed by Toshiba, Matsushita or SanDisk (SD[Secure Digital] memory Card or PC card), may be applied to the present invention.

What is claimed is:

1. A recording and reproducing apparatus for recording and reproducing main data and subsidiary data used for managing said main data, for a removable recording medium, said apparatus comprising:

recording and reproducing means for recording said main data and said subsidiary data on said recording medium;

storage means for storing said subsidiary data;

ejection means for causing said recording medium to be moved from a first position in which said recording medium is housed in a chassis to a second position in which said recording medium is partially extracted and an electrical connection between said recording medium and said recording and reproducing means is maintained, wherein
      when said recording medium is in said first position said recording medium is fully inserted in said chassis so that no portion of said recording medium is outside said chassis, and
      when said recording medium is in said second position said recording medium is partially inserted in said chassis so that a portion of said recording medium is outside said chassis;

detection means for detecting movement of said recording medium by said ejection means from said first position to said second position; and control means for controlling said recording and reproducing means so that recording of said main data on said recording medium is halted on detection of movement of said recording medium by said detection means and so that subsidiary data stored in said storage means which is relevant to any of said main data already recorded is recorded on said recording medium.

2. The recording and reproducing apparatus according to claim 1 further comprising:

notification means for making a notification to a user, and wherein said control means controls said notification means so that, if movement of said recording medium is detected by said detection means, notification will be made to said user that said user is to withhold releasing said recording medium.

3. The recording and reproducing apparatus according to claim 2 wherein said notification means is image displaying means.

4. The recording and reproducing apparatus according to claim 2 wherein said notification means is audio outputting means.

5. The recording and reproducing apparatus according to claim 1 wherein said recording and reproducing apparatus further writes data testifying to non-completion of recording of all of said main data on said recording medium prior to end of recording of said main data on said recording medium.

6. The recording and reproducing apparatus according to claim 5 wherein said recording and reproducing apparatus erases data testifying to non-completion of recording of all of said main data on said recording medium on completion of recording of said main data on said recording medium.

7. The recording and reproducing apparatus according to claim 5 further comprising:

reproducing means for reproducing data from said recording medium; and detection means for detecting that said data testifying to non-completion of recording of all of said main data on said recording medium is reproduced by said reproducing means, wherein when said detection means detects said data testifying to non-completion of recording of all of said main data on said recording medium, said control means causes said subsidiary data to be generated based on said main data reproduced by said reproducing means, causes said generated subsidiary data to be recorded on said recording medium by said recording means and causes said data testifying to non-completion of recording of all of said main data on said recording medium to be erased by said detection means.

8. A recording and reproducing method for recording main data and subsidiary data for managing said main data, on or from a removable recording medium, said method comprising the steps of:

recording said main data on said recording medium and generating said subsidiary data; and stopping recording of said main data on said recording medium and recording on said recording medium said generated subsidiary data relevant to any of said main data already recorded when it is detected that said recording medium ha s been moved from a first position in which said recording medium is housed in a chassis to a second position in which said recording medium is partially extracted and an electrical connection between said recording medium and recording and/or reproducing means is maintained, wherein when said recording medium is in said first position said recording medium is fully inserted in said chassis so that no portion of said recording medium is outside said chassis, and when said recording medium is in said second position said recording medium is partially inserted in said chassis so that a portion of said recording medium is outside said chassis.

9. The recording and reproducing method according to claim 8 further comprising the step of:

notifying a user to withhold from extracting said recording medium when it is detected that said recording medium is moved from said first position in which said recording medium is housed in said chassis towards said second position in which said recording medium is extracted and said electrical connection between said recording medium and said recording and/or reproducing means is maintained.

10. The recording and reproducing method according to claim 9 wherein said notification is by image display.

11. The recording and reproducing method according to claim 9 wherein said notification is by an audio output.

12. The recording and reproducing method according to claim 9 further comprising the step of:

writing data testifying to non-completion of recording of all of said main data on said recording medium prior to end of recording of said main data on said recording medium.

13. The recording and reproducing method according to claim 12 further comprising the step of:

erasing said data testifying to non-completion of recording of all of said main data on said recording medium from said recording medium on completion of recording of said main data on said recording medium.

14. The recording and reproducing method according to claim 12 further comprising the step of:

verifying whether or not said data testifying to non-completion of recording of all of said main data on said recording medium has been recorded on said recording medium;

generating said subsidiary data based on a portion of said main data recorded on said recording medium in case said verifying step has verified that there is said data testifying to non-completion of recording of all of said main data on said recording medium;

recording said generated subsidiary data on said recording medium; and erasing said data testifying to non-completion of recording of all of said main data on said recording medium from said recording medium.

* * * * *